United States Patent [19]
Akasaki

[11] Patent Number: 4,539,622
[45] Date of Patent: Sep. 3, 1985

[54] HYBRID INTEGRATED CIRCUIT DEVICE

[75] Inventor: Hidehiko Akasaki, Kawasaki, Japan

[73] Assignee: Fujitsu Limited, Kawasaki, Japan

[21] Appl. No.: 664,931

[22] Filed: Oct. 25, 1984

Related U.S. Application Data

[63] Continuation of Ser. No. 390,873, Jun. 22, 1982, abandoned.

[30] Foreign Application Priority Data

Jun. 25, 1981 [JP] Japan ............................ 56-94877[U]

[51] Int. Cl.³ .......................... H05K 1/09; H05K 1/14
[52] U.S. Cl. ..................................... 361/401; 156/89;
174/52 FP; 174/52 S; 264/61; 361/402;
361/414
[58] Field of Search ......................... 174/52 S, 52 FP;
361/393, 395, 401, 402, 414

[56] References Cited

U.S. PATENT DOCUMENTS

| | | | |
|---|---|---|---|
| 3,243,661 | 3/1966 | Ullery et al. ...................... | 361/393 X |
| 3,588,616 | 6/1971 | Palazzini ............................ | 361/402 |
| 3,665,592 | 5/1972 | Apospors ........................... | 29/588 |
| 3,760,090 | 9/1973 | Fowler ............................... | 361/421 X |
| 3,882,323 | 5/1975 | Smolker ............................. | 307/202 A |
| 4,208,698 | 6/1980 | Narasimhan ....................... | 361/414 |
| 4,225,900 | 9/1980 | Ciccio et al. ....................... | 361/395 |
| 4,288,841 | 9/1981 | Gogal ................................. | 361/401 X |
| 4,296,456 | 10/1981 | Reid ................................... | 361/412 X |
| 4,320,438 | 3/1982 | Ibrahim et al. .............. | 174/52 FP X |
| 4,342,069 | 7/1982 | Link ................................... | 361/401 |
| 4,439,754 | 3/1984 | Madden, Jr. .................... | 174/52 FP |

OTHER PUBLICATIONS

Patents Abstracts of Japan, vol. 6, No. 140, (E-121) (1018), Jul. 29th, 1982; & JP-A-57 64 953; Oki Denki Kogyo K.K., 4-20-1982; Semiconductor Device.
EPC Search Report, 82303178; 6/15/84, (3 pages).
IEEE Transactions on Components, Hybrids, and Manufacturing Technology, vol. CHMT-2, No. 2, 6/79, pp. 208-217; "Hybrid IC Structures using Solder Reflow Technology".
Patents Abstracts of Japan, vol. 5, No. 70, (E-56) (742), 5/12/81; JP A-56-21349; Fujitsu K.K., 2-27-1981; "Package for Integrated Circuit".
Chemical Abstracts, vol. 85, No. 12, 1976, p. 552, No. 85961s, Columbus, Ohio, U.S.; Y. Taketa et al.: "Composition and Electrical Properties of Ruthenium (IV) Oxide Thick Film Resistors" & Nippon Daigaku Seisan Kogakubu Kogoku, 1975, 8(1), 17-24.
Schmeig, J. W., DIP Storage Module with Stacked Chips, IBM Tech. Disc. Bull., vol. 23, #6, Nov. 1980, p. 2337.

Primary Examiner—R. R. Kucia
Attorney, Agent, or Firm—Staas & Halsey

[57] ABSTRACT

A hybrid integrated circuit device comprising in combination, a semiconductor integrated circuit element (1) and a film resistor pattern (7). The film resistor pattern is formed on the outer surface of a base (6) which is mounted on a multilayer ceramic package (2) which incorporates the element (1). In this assembled and operated hybrid device, function trimming of the film resistor pattern can be carried out by using a computer and testing is easier than is capable with prior art devices.

4 Claims, 3 Drawing Figures

4,539,622

HYBRID INTEGRATED CIRCUIT DEVICE

This is a continuation of co-pending application Ser. No. 390,873 filed on June 22, 1982, now abandoned.

BACKGROUND OF THE INVENTION (1) Field of the Invention

The present invention relates to a hybrid integrated circuit device comprising, in combination, a semiconductor integrated circuit element and one or more resistors.

(2) Description of the Prior Art

In a prior art hybrid device comprising active elements such as transistors and passive elements such as resistors, first, film resistors are printed on a printed board and then transistor elements and the like are bonded by soldering to the same board.

In recent years, active elements have been manufactured as semiconductor integrated circuit elements and, simultaneously, the printed board has been made of ceramic material so as to enhance the reliability of the hydrid integrated circuit device. In addition, the semiconductor integrated circuit element is housed in a ceramic package. In this case, the semiconductor integrated circuit element displays increased integration density and, accordingly, an increased number of connection terminals and a multilayer ceramic package having complex conductive layers is made.

In the above-mentioned prior art, however, since film resistors are formed on the printed board, the device is large in size, and, in addition, testing cannot be carried out on only the package (including the semiconductor integrated circuit element) without the printed board.

On the other hand, due to the development of such a semiconductor integrated circuit element used for a hybrid device, the resistance value of film resistors connected to the semiconductor circuit element cannot be fixed, and, accordingly, function trimming is desired in order to obtain the optimum resistance value of the film resistors. However, it is difficult to carry out such function trimming on the film resistors formed in the board on which, in this case, the package including the semiconductor integrated circuit element must be mounted.

SUMMARY OF THE INVENTION

It is, therefore, a principal object of the present invention to provide a hybrid integrated circuit device comprising a semiconductor integrated circuit element and one or more resistors which is small in size and in which testing can be easily carried out.

It is another object of the present invention to provide a hybrid integrated circuit device comprising a semiconductor integrated element and one or more resistors in which it is easy to carry out function trimming of the resistors.

According to the present invention, there is provided a hybrid integrated circuit device comprising: a semiconductor circuit element; a multilayer ceramic package including a first frame member creating a cavity for incorporating the semiconductor circuit element therein, a cap mounted on the first frame member so as to seal the cavity, and a second frame member mounted on the first frame member and surrounding the cap, the cap being thinner than the second frame member; external connection terminals mounted on the back of the multilayer ceramic package; a base mounted on the second frame member; and a film resistor pattern formed on the outer surface of the base and electrically connected to the semiconductor circuit element, the film resistor pattern being trimmed so that the resistance value of the film resistor pattern is adapted to the characteristics of the semiconductor circuit element.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
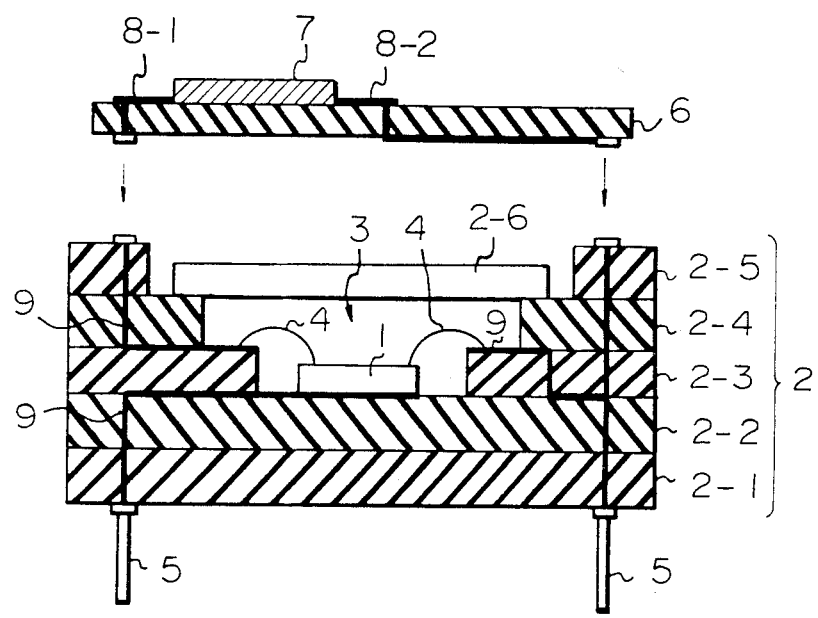
FIG. 1 is a cross-sectional view illustrating an embodiment of the hybrid semiconductor device according to the present invention.
Figure 2:
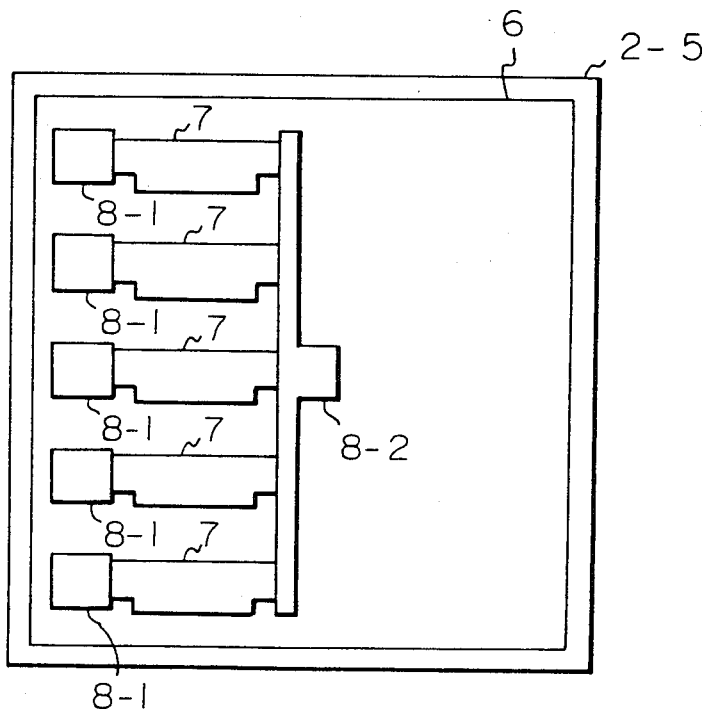
FIG. 2 is a plan view of FIG. 1.

In FIGS. 1 and 2, a semiconductor integrated circuit element (Chip) 1 is incorporated into a multilayer ceramic package 2 which is comprised of, for example, five ceramic layers 2-1 through 2-5 and a ceramic or metal cap 2-6. The ceramic layers 2-4 and 2-5 are frame-shaped, and the ceramic layer 2-5 and the cap 2-6 are mounted on the ceramic layer 2-4. In this case, the cap 2-6 is surrounded by the ceramic layer 2-5, and, in addition, the cap 2-6 is smaller in thickness than the ceramic layer 2-5. Note that the semiconductor integrated circuit element 1 is located within a sealed cavity 3 and is connected by bonding wires 4 to metallized conductive layers 9 which are connected to external connection terminals 5.

Reference numeral 6 indicates a base on which a thick film resistor pattern 7 is formed. The thick film resistor pattern 7 is connected to conductive layers 8-1 and 8-2, which are obtained by coating the base 6 with, for example, Pd/Ag paste and then firing it.

Conductive layers 9, which are within the multilayer ceramic package 2, are obtained by coating the surface of, or throughholes of, a raw ceramic sheet with, for example, a layer of molybdenum-manganese or tungsten, thereby laminating such raw ceramic sheets. The sheets are then fired at a high temperature in a reduction atmosphere including hydrogen gas. Therefore, the package 2 cannot be fired in an oxidation atmosphere. On the other hand, the base 6 is made of, for example, ceramic material or glass, and the thick film resistor pattern 7 is made of, for example, a mixture of oxide such as ruthenium oxide and glass powder. That is, the pattern 7 must be manufactured by coating the base 6 with such a mixture and then firing it in an oxidation atmosphere.

Therefore, according to the present invention, each of the two portions, that is, the package portion 2 and the thick film resistor portion 7, are each fired in a different atmosphere and, after that, the two portions are bonded to each other by, for example, soldering. In this case, the semiconductor integrated element 1 of the package 2 is assembled at a temperature of about 350° C. while the soldering temperature is about 200° C., which soldering temperature, accordingly, does not affect the assembled semiconductor integrated circuit element 1.

Usually in the prior art, during the testing mode for the integrated circuit element 1, it is impossible to adjust the resistance values of resistors within the element 1. Therefore, the circuit constants of the element 1 are modified by trimming the resistor pattern 7 during the operation state of the element 1. As a result, desired characteristics of the element 1 are obtained. Such a trimming is called a function trimming.

In the present invention, however, such trimming, and particularly function trimming, can be easily carried out. That is, probers (not shown) are connected to the external connection terminals 5 so as to operate the device of FIG. 1. In this operation state, the resistance value of the thick film resistor pattern 7 is adjusted precisely to a desired value by a laser trimming unit in which the trimming quantity is controlled by a computer. Thus, the resistance value optimum for the device is obtained.

Figure 3:
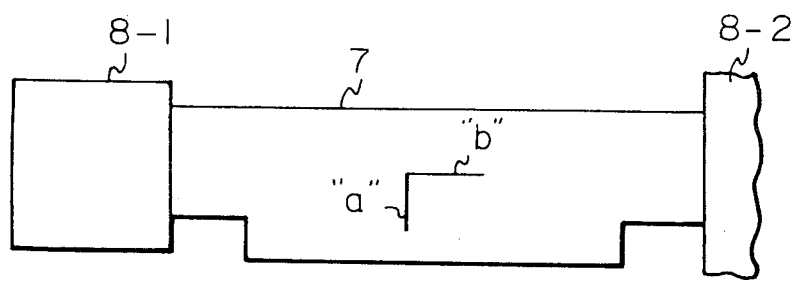
FIG. 3 is a partial enlargement of part of FIG. 2 for function trimming.

In FIG. 3, the trimming "a" crossing the resistor pattern 7 reduces the resistance value thereof greatly, while the trimming "b" parallel to the resistor pattern 7 reduces the resistance value thereof only a little. The two kinds of trimmings can be controlled as compared with a desired resistance value by using a computer.

As explained hereinbefore, the hybrid integrated circuit device according to the present invention is more advantageous than the prior art in that the device is small in size, testing can be easily carried out since the resistor pattern 7 is mounted on the package 2, the device can operate without a printed board, and precise function trimming of the resistor pattern 7 can be more easily carried out.

Note that it is preferable that a resistor electrically involving the semiconductor integrated circuit element 1 be arranged as close to the element 1 as possible. In view of this, the present invention is also advantageous as compared with the prior art.

I claim:
1. A hybrid integrated circuit device, comprising:
   (a) a semiconductor circuit element;
   (b) a multilayer ceramic package including—
      (i) a first frame member having a first surface and a second surface and creating a cavity therebetween for incorporating said semiconductor circuit element therein,
      (ii) a cap mounted on the second surface of said first frame member so as to seal said cavity, and
      (iii) a second frame member having a first surface and a second surface, wherein the first surface of the second frame member is mounted on said second surface of said first frame member and surrounding said cap, said cap being thinner than said second frame member;
   (c) external connection terminals mounted on the multilayer ceramic package opposite the second frame member;
   (d) a base having a first surface and a second surface, wherein the base's first surface is mounted on said second surface of said second frame member;
   (e) first and second conductive patterns formed on said base; said second conductive pattern being bonded to said first conductive pattern by soldering; and
   (f) a film resistor pattern formed on the second surface of said base and electrically connected to said first and second conductive patterns and to said semiconductor circuit element, said film resistor pattern being trimmed so that the resistance value of said film resistor pattern is adapted to the characteristics of said semiconductor circuit element.

2. A device as set forth in claim 1, wherein said multilayer ceramic package is manufactured by coating the outer surface of or through holes of a plurality of raw ceramic sheets with a layer of molybdenum-manganese and then laminating the plurality of raw ceramic sheets, which are then fired in a reduction atmosphere.

3. A device as set forth in claim 1, wherein said film resistor pattern is manufactured by coating the second surface of said base with a mixture of oxide and glass powder and then firing it in an oxidation atmosphere.

4. A device as set forth in claim 3, wherein said oxide comprises ruthenium oxide.

* * * * *